United States Patent
Yang et al.

(10) Patent No.: US 7,426,247 B2
(45) Date of Patent: Sep. 16, 2008

(54) MULTI-CHANNEL SERDES RECEIVER FOR CHIP-TO-CHIP AND BACKPLANE INTERCONNECTS AND METHOD OF OPERATION THEREOF

(75) Inventors: Fuji Yang, Old Bridge, NJ (US); Patrick Larsson, Matawan, NJ (US); Jay O'Neill, Freehold, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/561,355

(22) Filed: Nov. 17, 2006

(65) Prior Publication Data

US 2007/0092039 A1 Apr. 26, 2007

Related U.S. Application Data

(63) Continuation of application No. 09/955,424, filed on Sep. 18, 2001, now Pat. No. 7,158,587.

(51) Int. Cl.
*H03D 3/18* (2006.01)
(52) U.S. Cl. ...................................... 375/327
(58) Field of Classification Search ................ 375/327, 375/354, 355, 356, 373, 375, 376; 327/105, 327/156; 331/42, 17, 25, 57; 455/76, 316, 455/180.3; 329/307, 325, 360
See application file for complete search history.

(56) References Cited

U.S. PATENT DOCUMENTS

| | | | |
|---|---|---|---|
| 5,184,092 A | 2/1993 | Shahriary et al. | |
| 5,457,423 A | 10/1995 | Hegeler | |
| 5,651,031 A | 7/1997 | Ishizu | |
| 5,726,596 A | 3/1998 | Perez | |
| 6,018,547 A | 1/2000 | Arkhipkin et al. | |
| 6,510,185 B2* | 1/2003 | Lee et al. | 375/327 |
| 6,552,619 B2 | 4/2003 | Shastri | |
| 6,586,977 B2 | 7/2003 | Yang et al. | |
| 6,687,319 B1 | 2/2004 | Perino et al. | |
| RE38,482 E | 3/2004 | Leung et al. | |
| 6,795,695 B1 | 9/2004 | Brekelmans et al. | |
| 7,209,525 B2* | 4/2007 | Laturell et al. | 375/316 |

OTHER PUBLICATIONS

Younis et al. "A Low Jitter, Low Power, CMOS 1.25-3.125Gbps Transceiver", IEEE, Sep. 2001, p. 1-4.*

* cited by examiner

*Primary Examiner*—Sam K Ahn

(57) ABSTRACT

A multi-channel serializing/deserializing ("serdes") receiver, a method of operating the receiver and an integrated circuit configured as a serdes receiver. In one embodiment, the receiver includes:(1) a central frequency synthesizer configured to provide both in-phase and quadrature-phase clock signals and (2) a plurality of channel-specific receivers coupled to the central frequency synthesizer. Each of the plurality of channel-specific receivers is configured to receive and deserialize a data signal and include a clock recovery circuit having a phase detector and a phase interpolator. The interpolator is configured to receive the clock signals from the central frequency synthesizer and couple the phase detector and the central frequency synthesizer.

21 Claims, 5 Drawing Sheets

MULTI-CHANNEL SERDES RECEIVER FOR CHIP-TO-CHIP AND BACKPLANE INTERCONNECTS AND METHOD OF OPERATION THEREOF

CROSS REFERENCE TO RELATED APPLICATION

This application is a continuation of U.S. patent application Ser. No. 09/955,424, now U.S. Patent No. 7,158,587, entitled "MULTI-CHANNEL SERDES RECEIVER FOR CHIP-TO-CHIP AND BACKPLANE INTERCONNECTS AND METHOD OF OPERATION THEREOF," filed on Sep. 18, 2001, by Fuji Yang, et al., which is currently pending. The above-listed application is commonly assigned with the present invention and is incorporated herein by reference as if reproduced herein in its entirety.

TECHNICAL FIELD OF THE INVENTION

The present invention is directed, in general, to serializer/deserializer ("serdes") circuits and, more specifically, to a multi-channel serdes receivers for chip-to-chip and backplane interconnects and a method of operating the same.

BACKGROUND OF THE INVENTION

As technology continues to advance at an unprecedented rate, the transfer of information or data has remained a high priority. In addition, as processing speeds continue to increase, the speed at which information is transferred remains key in increasing overall system speed. Traditionally, parallel busses or cables have been coupled between multiple devices to transfer information during a processing function. However, problems that may degrade the data transferred, such as signal loss when transmitted over long distances, have led to improvements in the manner in which such data is transferred. In addition, the multitude of wires or cables necessary for parallel connection may become cumbersome, especially in larger systems. In the past, however, alternatives to parallel connections often led to information bottlenecks, leaving parallel lines as the only viable choice.

As the need for bandwidth expands in the various networks now existing, or even those later developed, serial backplanes (or busses) have become the ideal alternative for solving these problems. Typically, serial backplanes employ a serializer at a transmitting end to convert and transmit data in serial order and a deserializer at a receiving end to convert the data back to parallel form once received. Such serializer/deserializer ("serdes") receivers have become the benchmark for asynchronous communication and have provided clear advantages over parallel busses. For example, serdes receivers include transmitters and receivers, and use simplified wiring harnesses (often only a single wire per channel) that typically consume less power than their parallel-coupled counterparts. Higher performance may also be achieved because serdes receivers reduce the crosstalk that often occurs between parallel wires. In addition, serdes receivers may be employed to transmit data over long distances without the signal degradation experienced with parallel busses ultimately offering increased reliability and fidelity over parallel busses.

Although a tremendous improvement over parallel busses, serial connections employing serdes receivers are not without problems. Since a separate clock signal for component and signal synchronizing is not used (typical of asynchronous communication), the receiving and transmitting ends of a serdes are synchronized by monitoring the transmitted data. Within a conventional serial bus, each line of communication includes a separate serdes transceiver, each having a serdes receiver and transmitter, for serializing and deserializing each flume of data. As a result, each serdes receiver includes its own phase-locked loop (PLL) circuit, each typically employing a voltage controlled oscillator (VCO) to generate the clock at the receiving end of the data transmission and to synchronize the clock with the timing of the data signal at the transmitting end. Without this synchronization, the data transmitted would likely be corrupted or lost.

Among the more prominent problems typically found in conventional serial busses is the occurrence of crosstalk between VCOs in each of the serdes receivers. This crosstalk often results in skewed timing of the clocks, as well as jitter in the VCOs themselves. In addition, since each of the VCOs uses power to operate, the combined operation of multiple VCOs results in relatively large power consumption for the system.

Accordingly, what is needed in the art is a serdes receiver for use with a serial bus that does not suffer from the problems and deficiencies found in the prior art.

SUMMARY OF THE INVENTION

To address the above-discussed deficiencies of the prior art, the present invention provides a multi-channel serdes receiver, a method of operating the receiver and an integrated circuit configured as a serdes receiver. In one embodiment, the receiver includes: (1) a central frequency synthesizer configured to provide both in-phase and quadrature-phase clock signals and (2) a plurality of channel-specific receivers coupled to the central frequency synthesizer. Each of the plurality of channel-specific receivers is configured to receive and deserialize a data signal and include a clock recovery circuit having a phase detector and a phase interpolator. The interpolator is configured to receive the clock signals from the central frequency synthesizer and couple the phase detector and the central frequency synthesizer.

In one embodiment of the present invention, the central frequency synthesizer includes a voltage-controlled oscillator. Those skilled in the pertinent art will understand that other types of frequency synthesizers are within the broad scope of the present invention.

In one embodiment of the present invention, the central frequency synthesizer is a phase-locked loop (PLL). The phase-locked loop, while not essential to the present invention, improves the stability and reliability of the central frequency synthesizer.

In one embodiment of the present invention, the plurality further includes at least one integrator coupled to the phase interpolator and a demultiplexer. In a more specific embodiment, the at least one integrator performs an integrate-and-dump function. The structure and function of the at least one integrator and the demultiplexer will be described in greater detail in the Detailed Description that follows.

In one embodiment of the present invention, the phase interpolator and the phase detector comprise a delay-locked loop (DLL). One possible architecture for a such a delay-locked loop is set forth in U.S. patent application Ser. No. 09/947,488, filed on Sep. 6, 2001, entitled "Four Quadrant Analog Mixer-Based Delay-Locked Loop (DLL) for Clock and Data Recovery," that has now issued as U.S. Pat. No. 6,586,977 and is incorporated herein by reference.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following detailed description taken in conjunction with the accompanying FIGURES. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

The present invention introduces a multi-channel serdes receiver built around a central frequency synthesizer (clock) and distributed clock and data recovery in each channel-specific receiver. The clock and data recovery circuit in each channel-specific receiver tracks the frequency offset between the incoming data's clock and the clock generated by the central frequency synthesizer ("PLL"). The multi-channel serdes receiver presented here is capable of tolerating frequency offset between a plurality of channels. Centralizing the clock reduces interference that occurs when multiple frequency synthesizers run proximate one another and reduces power consumption and concomitant heat generation, which is particularly important when the serdes receiver is embodied as an integrated circuit.

Figure 1:
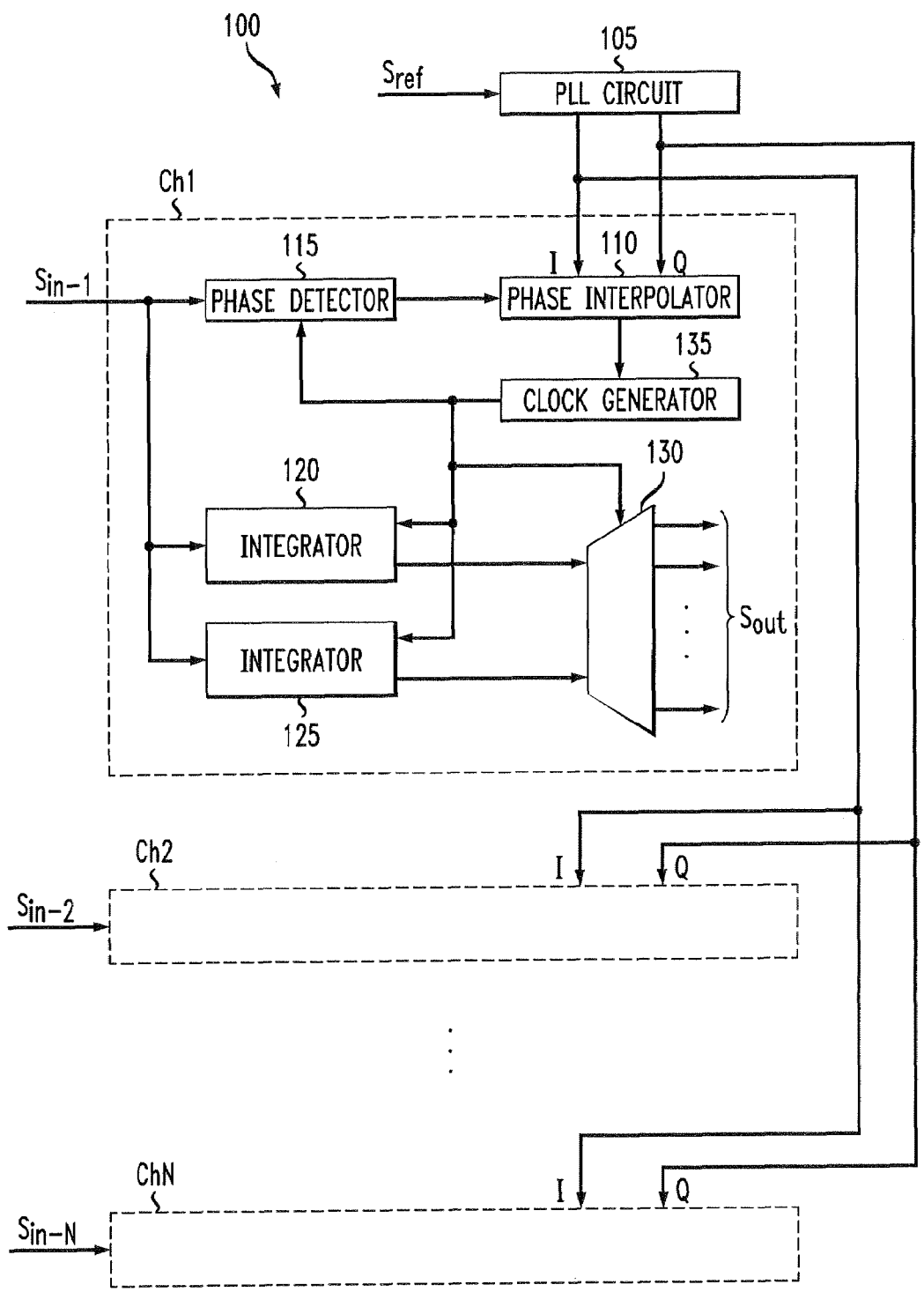
FIG. 1 illustrates a block diagram of a multi-channel serdes receiver constructed according to the principles of the present invention.

Turning now to FIG. 1, illustrated is a block diagram of a multi-channel serdes receiver 100 constructed according to the principles of the present invention. As illustrated, the receiver 100 includes N (an arbitrary number of) channel-specific receivers, Ch1, Ch2 . . . ChN, which correspond directly to the number of channels desired. Those skilled in the art understand that a separate channel may be used for each data transmission stream desired. Although only the components of the first channel, Ch1, are illustrated in detail, it should be understood that the channel-specific receivers for the second through the Nth channels include similar components. However, those components are not discussed here in detail in order to avoid repetition.

Unlike serdes receivers found in the prior art, the serdes receiver 100 of the present invention includes only a single PLL circuit 105. The PLL circuit 105 includes a central frequency synthesizer, which, in an advantageous embodiment, is a VCO. The PLL circuit 105 employs the central frequency synthesizer to generate an in-phase signal, I, and a quadrature phase signal, Q, based on a reference signal $S_{ref}$. In one embodiment, the reference signal $S_{ref}$ is a master clock signal for use by surrounding circuits and components, including the serdes receiver 100. As shown in FIG. 1, the in-phase and quadrature phase signals, I and Q, are then provided to the channel-specific receivers, CH1, Ch2, ChN, of the serdes receiver 100 for use in deriving a clock signal for each of the channels. Derivation of a clock signal for the first channel Ch1 will now be described in greater detail. (Derivation of the clock signal is identical for each of the multiple channels of the serdes receiver 100.)

The in-phase and quadrature phase signals, I and Q, are provided to a phase interpolator 110. Though not necessary to the broad scope of the present invention, the phase interpolator 110 in the illustrated embodiment is an analog mixer-based phase interpolator. A first input signal $S_{in-1}$ is provided to a clock generation circuit 135, and then to a phase detector (PD) 115. An output of the PD 115 is provided to the phase interpolator 110 along with the in-phase and quadrature phase signals, I and Q. The function of the clock generation circuit 135 will be discussed in detail with reference to FIGS. 2 and 3. The phase interpolator 110, together with the phase detector 115, comprise a delay-locked loop (DLL), such as the DLL described in U.S. Pat. No. 6,586,977. The benefits and advantages of clock and data recovery using a DLL circuit of the type described therein are discussed in detail in the co-pending application, so that discussion will not be repeated here.

In the illustrated embodiment, the input signal $S_{in}$ represents the data transmitted to the serdes receiver 100 through a serial line. Of course, to other multiple channels Ch2, ChN, of the serdes receiver 100 receives an input signal $S_{in-2}$, $S_{in-N}$ unique to each particular channel Ch2, ChN. The PD 115 is employed to compare a phase of the first input signal $S_{in}$ to the recovered clock, and that result is used to determine the output of the PD 115 used by the phase interpolator 115 to perform clock and data recovery for the first channel Ch1.

An output of the phase interpolator 110 is then fed back to the PD 115. That feedback output is used by the PD 115, in addition to the first input signal $S_{in-1}$, to derive and generate the output of the PD 115. The output of the phase interpolator 110, which will be discussed in greater detail below, is also provided to first and second integrators 120, 125. Also, the first input signal $S_{in-1}$ is provided to the first and second integrators 120, 125 for use in the deserialization process. The outputs of the first and second integrators 120, 125 are provided to a demultiplexer 130. The demultiplexer 130 provides a final step in the deserialization process and the output of the demultiplexer 130 is the data in parallel form.

With this broad description, it is clear that the present invention introduces a multi-channel serdes receiver built around a central frequency synthesizer (clock) and distributed clock and data recovery circuits in each channel. By removing the separate clocks from each of the channel-specific receivers, Ch1, Ch2, ChN, and centralizing the clock, interference that typically occurs when multiple frequency synthesizers run proximate one another may be reduced. In addition, power consumption and concomitant heat generation, which is particularly important when the serdes receiver 100 is embodied as an integrated circuit, may also be reduced.

Figure 2:
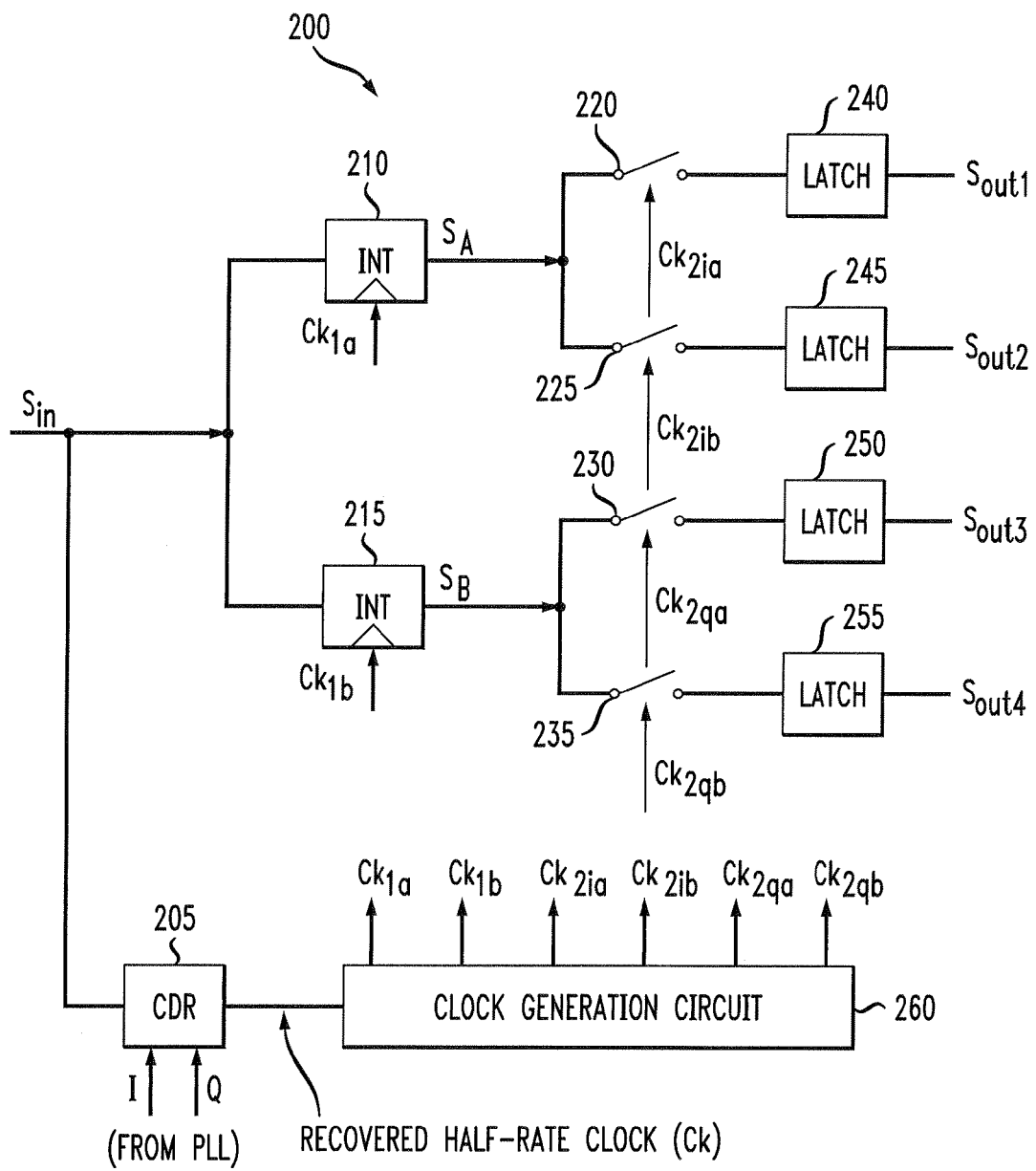
FIG. 2 illustrates a block diagram of one embodiment of the front end 1:4 demultiplexer of a multi-channel serdes receiver manufactured according to the principles of the present invention.

Turning now to FIG. 2, illustrated is a block diagram of one embodiment of the front end 200 of a multi-channel serdes receiver manufactured according to the principles of the present invention. In the illustrated embodiment, the front end 200 represents a 1:4 deserialization (demultiplexing) of an incoming serial data signal $S_{in}$. Those skilled in the art understand that a serdes receiver according to the present invention may provide other ratios for deserializing data signals, and the present invention is not limited to any particular ratio.

To perform the 1:4 deserializing, a 1:2 deserialization is first realized through first and second integrators 210, 215. The first and second integrators 210, 215 are controlled respectively by first and second waves $Ck_{1a}$, $Ck_{1b}$ of a recovered half-rate clock signal (collectively Ck) generated by a clock and data recovery circuit (CDR) 205 and a clock generation circuit 260. In an advantageous embodiment, the integrators 210, 215 in FIG. 2 perform an integrating and dumping function by integrating the first input signal $S_{in-1}$ over a one-bit period and then resetting to zero.

To finish the 1:4 deserializing of the first input signal $S_{in-1}$, a second 1:2 deserializing step is then performed. More specifically, the first integrator output $S_A$ is further deserialized by a factor of 2 through first and second switches 220, 225. Likewise, the second integrator output $S_B$ is also deserialized by a factor of 2 by third and fourth switches 230, 235. In a more specific embodiment, the switches 220, 225, 230, 235 are "sample and hold" switches, however any suitable switching device may be employed to further deserialize/demultiplex the first input signal $S_{in-1}$ in accordance with the principles described herein.

The first and second switches 220, 225 are controlled by first and second waves $Ck_{2ia}$, $Ck_{2ib}$ of a divided-by-two in-phase recovered half-rate clock signal (collectively $Ck_{2i}$) generated by the clock generation circuit 260. Similarly, the third and fourth switches 230, 235 are controlled by first and second portions $Ck_{2qa}$, $Ck_{2qb}$ of a divided-by-two quadrature phase clock signal (collectively $Ck_{2q}$) also generated by the clock generation circuit 260. In the illustrated embodiment of the front end 200, the in-phase and quadrature clock signals $Ck_{2ia}$, $Ck_{2ib}$, $Ck_{2qa}$, $Ck_{2qb}$ are divide-by-two clocks derived from the recovered half-rate clock signal Ck. Of course, the source of the in-phase and quadrature phase recovered half-rate clock signals $Ck_{2ia}$, $Ck_{2ib}$, $Ck_{2qa}$, $Ck_{2qb}$ may be different depending on the desired operation of the front end 200 of the serdes receiver.

Figure 3:
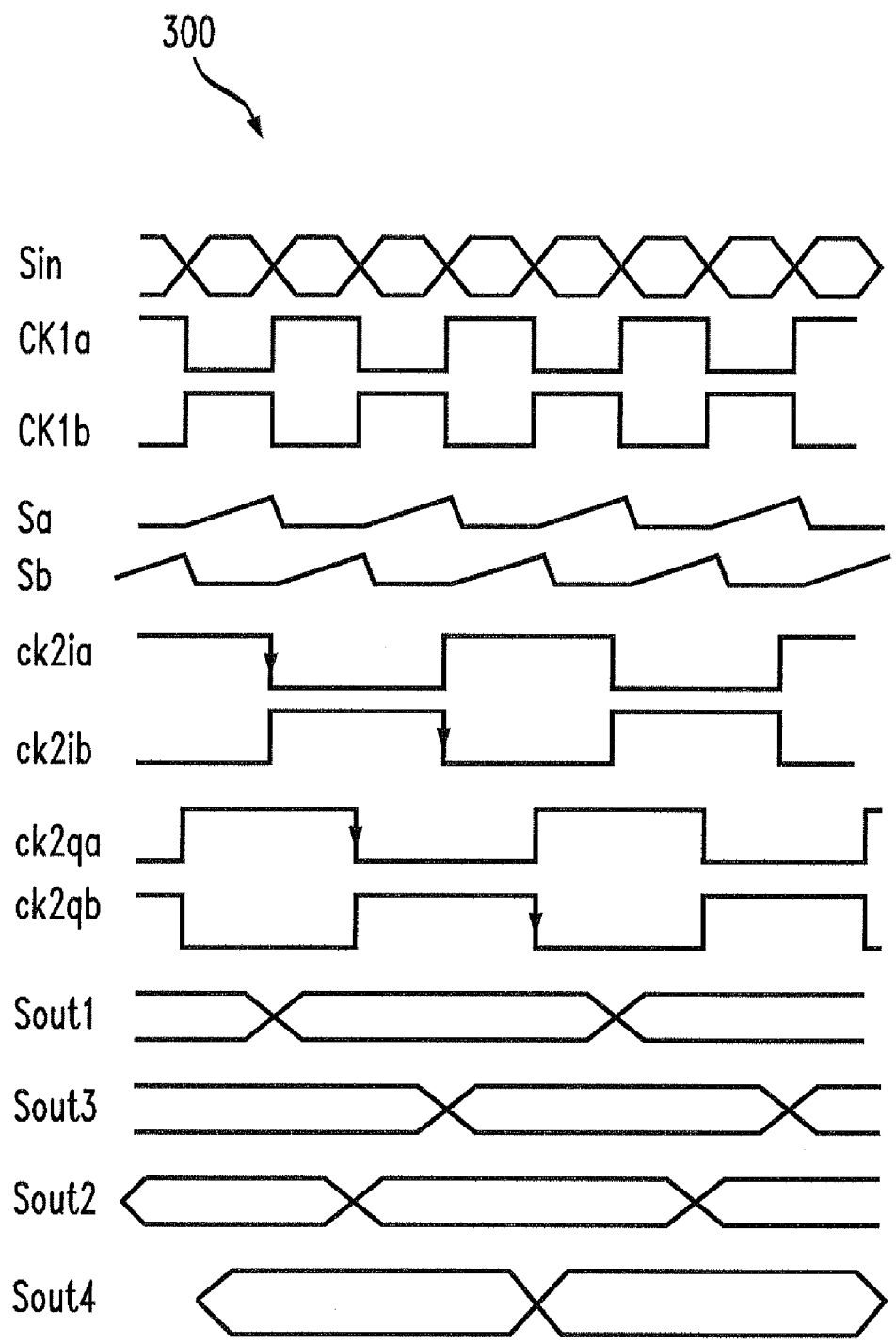
FIG. 3 illustrates a timing diagram of the 1:4 deserializing operation performed by the front end of a serdes receiver of the present invention.

To complete the 1:4 deserializing of the first input signal $S_{in-1}$, the four outputs of the switches 220, 225, 230, 235 are regenerated using first, second, third and fourth latches 240, 245, 250, 255. The latches 240, 245, 250, 255 generate first, second, third and fourth output signals $S_{out1}$, $S_{out2}$, $S_{out3}$, $S_{out4}$. The output signals $S_{out1}$, $S_{out2}$, $S_{out3}$, $S_{out4}$ represent the parallel data signals typically found in equipment communicating with a parallel backplane. Turning briefly to FIG. 3, illustrated is a timing diagram 300 of the 1:4 deserializing operation performed by the front end 200 of a serdes receiver of the present invention.

Figure 4:
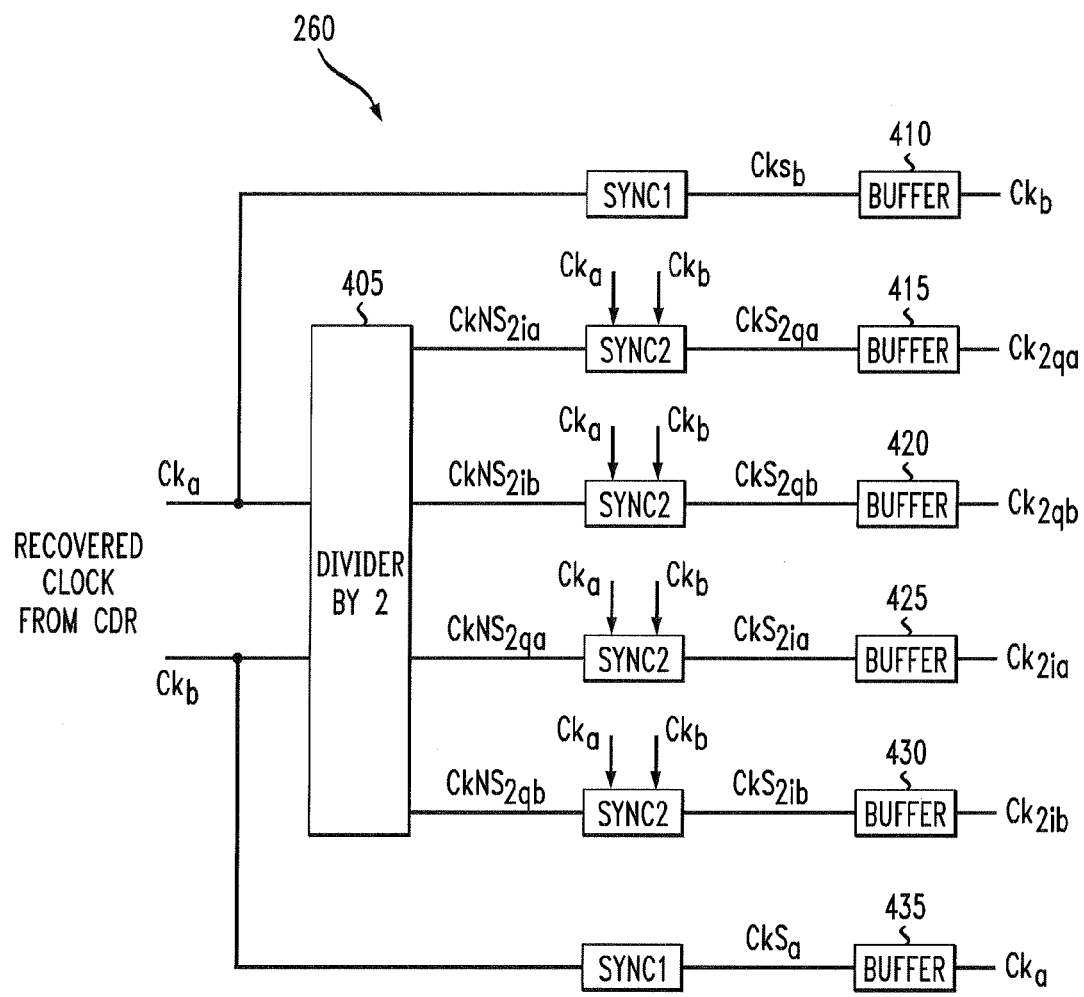
FIG. 4 illustrates a block diagram of one embodiment of the clock generation circuit discussed with respect to FIG. 2.
Figure 5:
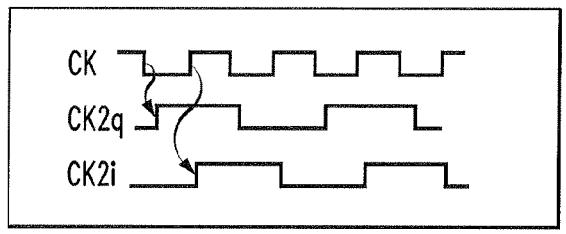
FIG. 5 illustrates a timing diagram of waveforms demonstrating the quadrature phase relationship between first and second in-phase signals and first and second quadrature phase signals.

Referring now to FIG. 4, illustrated is a block diagram of one embodiment of the clock generation circuit 260 discussed with respect to FIG. 2. As illustrated, a divider 405 divides-by-two first and second recovered clock signals $Ck_a$, $Ck_b$ ($Ck_a$, $Ck_b$ are complimentary and may be denoted collectively as Ck) to generate first and second non-synchronized in-phase signals $CkNS_{2ia}$, $CkNS_{2ib}$ and first and second non-synchronized quadrature phase signals $CkNS_{2qa}$, $CkNS_{2qb}$. In an exemplary embodiment, the non-synchronized first and second in-phase signals $CkNS_{2ia}$, $CkNS_{2ib}$ and non-synchronized first and second quadrature phase signals $CkNS_{2qa}$, $CkNS_{2qb}$ have a quadrature phase relationship. Turning briefly to FIG. 5, the waveforms illustrated therein exhibit this phase relationship.

Figure 6:
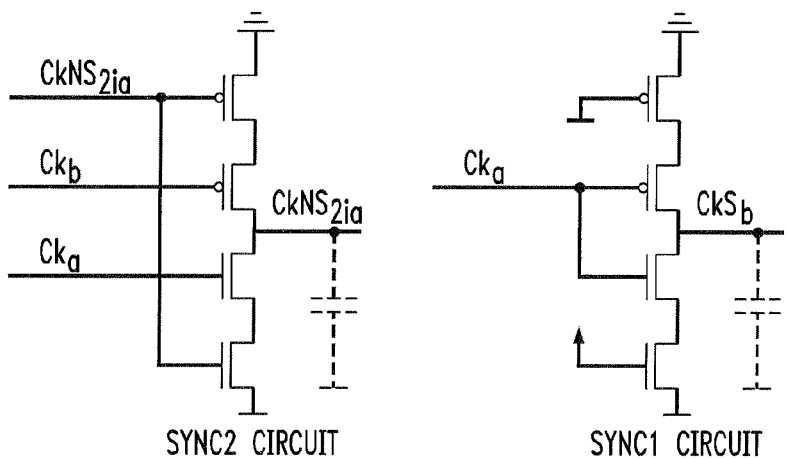
FIG. 6 illustrates one embodiment of first and second synchronizing circuits discussed with respect to FIG. 4.

Returning to FIG. 4, also illustrated are first and second synchronizing circuits Sync1, Sync2. In this embodiment, the second synchronizing circuits Sync2 are used to re-synchronize the non-synchronized first and second in-phase signals $CkNS_{2ia}$, $CkNS_{2ib}$ and the non-synchronized first and second quadrature phase signals $CkNS_{2qa}$, $CkNS_{2qb}$ with the first and second recovered clock signals $Ck_a$, $Ck_b$. The synchronization is performed by using the first and second recovered clock signals $Ck_a$, $Ck_b$ to sample the non-synchronized first and second in-phase signals $CkNS_{2ia}$, $CkNS_{2ib}$ and the non-synchronized first and second quadrature phase signals $CkNS_{2qa}$, $CkNS_{2qb}$. The synchronizing circuits Sync1, Sync2 and sampling are illustrated in FIG. 6.

Figure 7:
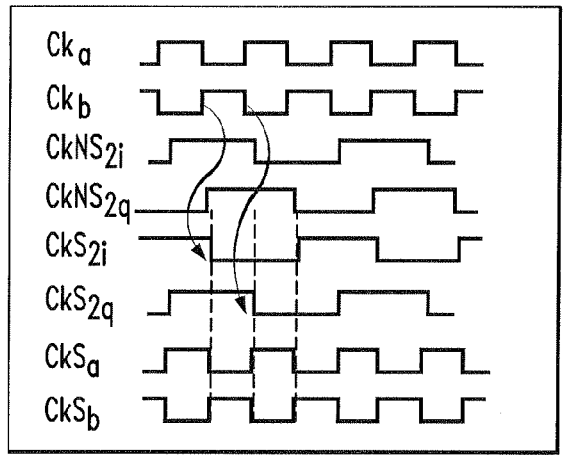
FIG. 7 illustrates a timing diagram of waveforms representing the several signals shown in the clock generating circuit 260 of FIG. 4.

To have true synchronized clocks, the first synchronizing circuit Sync1 is added into the signal path of the first and second recovered clock signals $Ck_a$, $Ck_b$ in order to match the delay introduced by the second synchronizing circuits Sync2. In this particular embodiment, since the first and second synchronizing circuits Sync1, Sync2 have substantially the same circuit topology and signal path (see FIG. 6), the delays associated with the synchronizing circuits Sync1, Sync2 are matched. Looking at FIG. 7, illustrated is a timing diagram 700 of waveforms representing the several signals associated with the clock generation circuit 260 of FIG. 4. The relationships between the original recovered clock signals $Ck_a$, $Ck_b$, the non-synchronized in-phase and quadrature phase signals $CkNS_{2ia}$, $CkNS_{2ib}$, $CkNS_{2qa}$, $CkNS_{2qb}$, the synchronized in-phase and quadrature phase signals $CkS_{2ia}$, $CkS_{2ib}$, $CkS_{2qa}$, $CkS_{2qb}$, and the final signals $Ck_a$, $Ck_b$, $Ck_{2ia}$, $Ck_{2ib}$, $Ck_{2qa}$, $Ck_{2qb}$ output from buffers 440-465 coupled to the first and second synchronizing circuits Sync1, Sync2 are illustrated therein.

By building a multi-channel serdes receiver around a central frequency synthesizer and distributed clock and data recovery systems for each channel, the present invention provides several notable advantages over the prior art. For instance, the present invention provides for removing the separate clocks from all channel-specific receivers and centralizing the clock, reducing interference that typically occurs when multiple frequency synthesizers run proximate one another. Power consumption and concomitant heat generation is also reduced with this configuration, which is particularly important when the serdes receiver is embodied as an integrated circuit. Those skilled in the art understand that reducing the number of frequency synthesizers within a serdes receiver allows for more efficient power consumption, as well as reducing or eliminating the chance for crosstalk and jitter. Moreover, a serdes receiver, as well as a method of operating a serdes receiver, according to the principles of the present invention is employable in almost any environment where asynchronous communication using serial busses or backplanes is desirable, while retaining benefits such as those described above.

Although the present invention has been described in detail, those skilled in the art should understand that they can make various changes, substitutions and alterations herein without departing from the spirit and scope of the invention in its broadest form.

What is claimed is:

1. A multi-channel serdes receiver, comprising:
a central frequency synthesizer configured to provide both in-phase and quadrature-phase clock signals; and
a plurality of channel-specific receivers coupled to said central frequency synthesizer, each of said plurality of channel-specific receivers configured to receive and deserialize a data signal and include a clock recovery circuit having a phase detector, at least one integrator coupled to said phase detector and a demultiplexer, and a phase interpolator, said interpolator configured to receive said clock signals from said central frequency synthesizer and couple said phase detector and said central frequency synthesizer.

2. The receiver as recited in claim 1 wherein said central frequency synthesizer includes a voltage-controlled oscillator.

3. The receiver as recited in claim 1 wherein said central frequency synthesizer is a phase-locked loop.

4. The receiver as recited in claim 1 wherein said at least one integrator performs an integrate-and-dump function.

5. The receiver as recited in claim 1 wherein said clock recovery circuit comprises a delay-locked loop clock and data recovery cicuit.

6. The receiver as recited in claim 1 wherein said plurality includes two integrators configured to perform a first 1:2 demultiplexing operation and four latches coupled to said integrators and configured to perform a second 1:2 demultiplexing operation.

7. The receiver as recited in claim 1 further comprising a clock generation circuit coupled to said phase interpolator and configured to generate a plurality of clock signals.

8. The receiver as recited in claim 7 further comprising at least one synchronizer configured to reduce skew between said plurality of clock signals.

9. A method of operating a multi-channel serdes receiver, comprising:
generating a central clock signal having both in-phase and quadrature-phase clock signals with a central frequency synthesizer; and
transmitting said central clock signal to a plurality of channel-specific receivers coupled to said central frequency synthesizer, each of said plurality receiving and deserializing a data signal and including a clock recovery circuit having a phase detector, at least one integrator coupled to said phase detector and a demultiplexer, and a phase interpolator, said interpolator receiving said clock signals from said central frequency synthesizer.

10. The method as recited in claim 9 wherein said central frequency synthesizer includes a voltage-controlled oscillator or a phase-locked loop.

11. The method as recited in claim 9 wherein said at least one integrator performs an integrate-and-dump function.

12. The method as recited in claim 9 wherein said clock recovery circuit comprises a delay-locked loop clock and data recovery circuit.

13. The method as recited in claim 9 wherein said plurality includes two integrators, said integrators performing a first 1:2 demultiplexing operation, and four latches coupled to said integrators, said latches performing a second 1:2 demultiplexing operation.

14. The method as recited in claim 9 further comprising generating a plurality of clock signals via a clock generation circuit coupled to said phase interpolator and reducing a skew between said plurality of clock signals with at least one synchronizer.

15. An integrated circuit, comprising:
a substrate; and
a plurality of circuit layers located over said substrate and arranged to form a multi-channel serdes receiver that includes:
a central frequency synthesizer configured to provide both in-phase and quadrature-phase clock signals; and
a plurality of channel-specific receivers coupled to said central frequency synthesizer, each of said plurality of channel-specific receivers configured to receive and deserialize a data signal and include a clock recovery circuit having a phase detector, a phase interpolatorand at least one integrator that performs an integrate-and-dump function and is coupled to said phase detector and a demultiplexer, said interpolator configured to receive said clock signals from said central frequency synthesizer.

16. The integrated circuit as recited in claim 15 wherein said central frequency synthesizer includes a voltage-controlled oscillator.

17. The integrated circuit as recited in claim 15 wherein said central frequency synthesizer is a phase-locked loop.

18. The integrated circuit as recited in claim 15 wherein said clock recovery circuit comprises a delay-locked loop clock and data recovery circuit.

19. The integrated circuit as recited in claim 15 wherein said plurality includes two integrators configured to perform a first 1:2 demultiplexing operation and four latches coupled to said integrators and configured to perform a second 1:2 demultiplexing operation.

20. The integrated circuit as recited in claim 15 further comprising a clock generation circuit coupled to said phase interpolator and configured to generate a plurality of clock signals.

21. The integrated circuit as recited in claim 20 further comprising at least one synchronizer configured to reduce skew between said plurality of clock signals.

* * * * *